United States Patent
Chakravarthi et al.

(10) Patent No.: US 7,112,516 B2
(45) Date of Patent: Sep. 26, 2006

(54) FABRICATION OF ABRUPT ULTRA-SHALLOW JUNCTIONS

(75) Inventors: Srinivasan Chakravarthi, Richardson, TX (US); Periannan Chidambaram, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/677,614

(22) Filed: Oct. 2, 2003

(65) Prior Publication Data

US 2004/0082151 A1  Apr. 29, 2004

Related U.S. Application Data

(62) Division of application No. 10/020,813, filed on Dec. 12, 2001, now Pat. No. 6,849,528.

(51) Int. Cl.
   *H01L 21/22* (2006.01)
(52) U.S. Cl. ............... 438/486; 438/473; 257/E21.133
(58) Field of Classification Search ............... 438/162, 438/473, 528, 486, 166, 289; 257/E21.133
   See application file for complete search history.

(56) References Cited

U.S. PATENT DOCUMENTS

| | | | | |
|---|---|---|---|---|
| 5,976,939 A | * | 11/1999 | Thompson et al. | 438/305 |
| 5,994,175 A | * | 11/1999 | Gardner et al. | 438/199 |
| 6,037,640 A | | 3/2000 | Lee | |
| 6,069,062 A | * | 5/2000 | Downey | 438/528 |
| 6,153,920 A | * | 11/2000 | Gossmann et al. | 257/607 |
| 6,812,523 B1 | * | 11/2004 | Chu et al. | 257/335 |
| 2001/0041432 A1 | * | 11/2001 | Lee | 438/530 |

OTHER PUBLICATIONS

S. Saito, "Defect reduction by MeV ion implantation for shallow junction formation," Appl. Phys. Lett. vol. 63, No. 2, pp. 197-199. Jul. 12, 1993.*
T.H. Huang et al., "Influence of fluorine preamorphization on the diffusion and activation of low-energy implanted boron during rapid thermal annealing," Appl. Phys. Lett. vol. 65, No. 14, pp. 1829-1831. Oct. 3, 1994.*
P. Packan et al., "Modeling Solid Source Boron Diffusion for Advanced Transistor Applications" IEEE, IEDM 98, pp. 505-508.
Daniel F. Downey et al., "Effect of Fluorine on the Diffusion of Boron in Ion Implanted Si" 1998 American Institute of Physics, vol. 73, No. 9, Aug. 31, 1998, pp. 1263-1265.

* cited by examiner

*Primary Examiner*—Carl Whitehead, Jr.
*Assistant Examiner*—Jennifer M Dolan
(74) *Attorney, Agent, or Firm*—Rose Alyssa Keagy; W. James Brady, III; Frederick J. Telecky, Jr.

(57) ABSTRACT

One aspect of the invention relates to a method of forming P-N junctions within a semiconductor substrate. The method involves providing a temporary impurity species, such as fluorine, within the semiconductor crystal matrix prior to solid source in-diffusion of the primary dopant, such as boron. The impurity atom is a faster diffusing species relative to silicon atoms. During in-diffusion, the temporary impurity species acts to reduce the depth to which the primary dopant diffuses and thereby facilitates the formation of very shallow junctions.

5 Claims, 5 Drawing Sheets

FABRICATION OF ABRUPT ULTRA-SHALLOW JUNCTIONS

This is a division of application Ser. No. 10/020,813, filed Dec. 12, 2001, the entire disclosure of which is hereby incorporated herein by reference, now U.S. Pat. No. 6,849,528.

FIELD OF THE INVENTION

The present invention relates generally to semiconductor device manufacturing and more particularly to methods of manufacturing devices with ultra-shallow junctions.

BACKGROUND OF THE INVENTION

In the semiconductor industry, there is a continuing trend toward high device densities. To achieve these high device densities, small features on semiconductor wafers are required. These features include source regions, drain regions, and channel regions that relate to devices, such as field effect transistors (FETs).

In the process of scaling down complementary metal oxide semiconductor (CMOS) devices, which are a type of FET, a vertical dimension must be reduced at the same time as horizontal dimensions are reduced. In particular, source and drain regions, or at least source drain extension regions adjacent the channel, must be made extremely shallow, with a corresponding increase in doping, in order to avoid short channel effects. For example, the source/drain extension regions adjacent the channel of a 0.1 μm CMOS device must be no more than about 50 nm thick and have a dopant concentration of about $5 \times 10^{19}$ atom/cm$^3$ or greater.

The formation of ultra-shallow junctions, that is, junctions having source/drain regions no more than about 50 nm thick, is considered one of the significant challenges in manufacturing the next generation of CMOS devices. The usual approach to forming source/drain regions is ion implantation. A recognized shortcoming of ion implantation is that it produces interstitial atoms that can greatly enhance (10 to 1000 times) the diffusivity of dopants. Enhanced diffusivity causes undesirable spreading of the dopants during thermal annealing that is carried out to repair the crystal structure of the substrate after doping.

Fluorine co-implants have been tried as an approach to reducing the enhanced diffusivity caused by ion implantation used to incorporate the dopant atoms. This has been found to be partially successful in mitigating the enhancement caused by ion implantation Higher temperatures raise the diffusivity and offset the benefit of the co-implants. Thus, there remains an unsatisfied need for effective methods of forming ultra-shallow junctions.

SUMMARY OF THE INVENTION

The following presents a simplified summary in order to provide a basic understanding of some aspects of the invention. This summary is not an extensive overview of the invention. It is intended neither to identify key or critical elements of the invention nor to delineate the scope of the invention. Rather, the primary purpose of the summary is to present some concepts of the invention in a simplified form as a prelude to the more detailed description that is presented later.

One aspect of the invention relates to a method of forming P-N junctions within a semiconductor substrate. The method involves providing a temporary impurity atom, such as fluorine, within the semiconductor substrate crystal matrix prior to in-diffusion of a primary dopant, such as boron. The impurity atom is a faster diffusing species relative to silicon atoms. During in-diffusion, the second dopant acts to reduce the depth to which the dopant diffuses and thereby facilitates the formation of very shallow junctions.

Another aspect of the invention relates to a method of doping a single crystal semiconductor substrate. The method involves pre-amorphizing a layer of the crystal adjacent the surface, implanting the substrate with a temporary dopant, and heating the substrate to cause the crystal to re-grow within the layer adjacent the surface. The temporary dopant becomes incorporated within the crystal matrix of the re-grown layer. In-diffusion is then carried out by forming a coating comprising a target dopant over the surface of the substrate and annealing to cause the target dopant to diffuse from the coating into the substrate. Very shallow junctions can thereby be formed.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1:
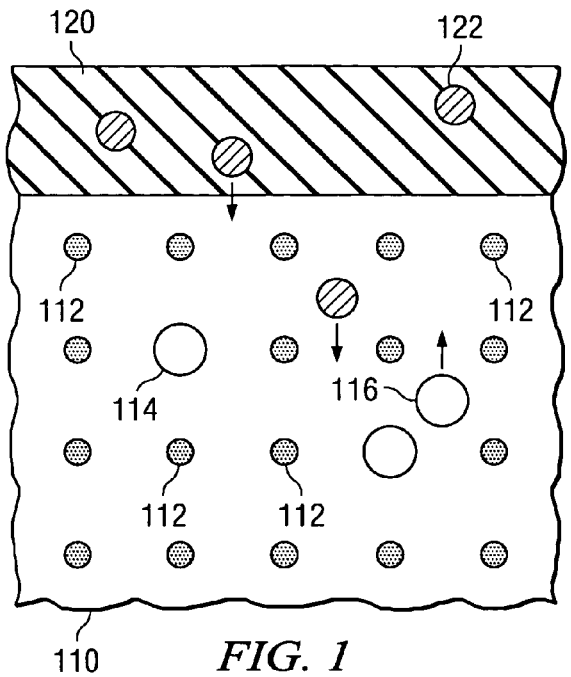
FIG. 1 is a schematic illustration of a process of the invention.

The present invention will now be described with reference to the attached drawings, wherein like reference numerals are used to refer to like elements throughout. FIG. 1 illustrates a process of the present invention. Substrate 110 comprises a single crystal of semiconductor atoms 112 in which are substituted atoms 114 of what can be referred to as a temporary dopant. Solid source 120, which comprises target dopant atoms 122, is provided as a coating over the substrate 110. During the process of the invention, the substrate 110 and the solid source 120 are heated. Heating causes a portion of the target dopant atoms 122 to enter the substrate 110, diffuse through the substrate 110, and become substituted in the crystal matrix of the substrate 110. Heating also causes a portion of the temporary dopant atoms 114 to react with interstitials within the substrate 110 and form interstitial species 116, which diffuse out of the substrate 110. The temporary dopant atoms 114 function to remove interstitials from the crystal matrix during in-diffusion of the target dopant atoms 122 and thereby substantially reduce the depth to which the target dopant atoms 122 penetrate during the in-diffusion process.

Figure 2:
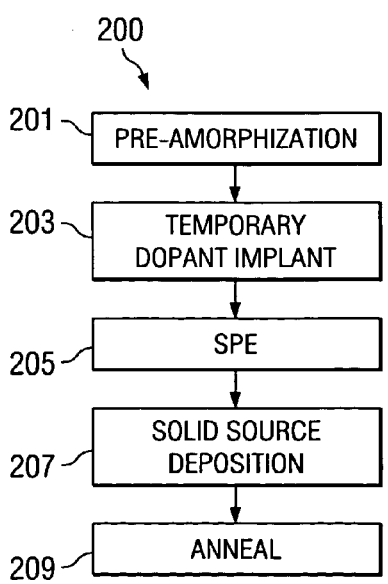
FIG. 2 is a flow chart of a process according to one aspect of the present invention.

FIG. 2 is a flow chart of an exemplary process 200, according to one aspect of the present invention, for forming a P-N junction within a semiconductor substrate. Process 200 is illustrated and described as a series of acts or events, including pre-amorphization 201, implanting a temporary dopant 203, re-growing the crystal by solid phase epitaxial growth (SPE) 205, depositing a dopant-containing solid source 207, and annealing 209. The present invention is not limited by the illustrated ordering of such acts or events, as some acts may occur in different orders and/or concurrently with other acts or events. In addition, not all illustrated acts or events are required to implement a methodology in accordance with the present invention.

The semiconductor substrate includes a semiconductor crystal, typically silicon. Other examples of semiconductors include GaAs and InP. In addition to a semiconductor crystal, the substrate may include various elements therein and/or layers thereon. These can include metal layers, barrier layers, dielectric layers, device structures, active elements and passive elements including word lines, source regions, drain regions, bit lines, bases, emitters, collectors, conductive lines, conductive vias, etc.

Act 201 is pre-amorphizing a layer of the semiconductor crystal adjacent a surface of the substrate. Subsequently, a temporary dopant implant, Act 203, takes place. Pre-amorphization can be carried out by any suitable means, but generally involves bombarding the surface with ions. Almost any type of ion can be used for pre-amorphization, including, for example, ions of Ge, Sb, In, Si, Ar, or F.

The thickness of the pre-amorphized layer is generally selected to be at least co-extensive with the thickness of the layer in which temporary dopant is desired, which is in turn selected to be at least about the thickness of the layer in which the target dopant is desired. Typical thicknesses for the pre-amorphized layer are in the range from about 10 to about 100 nm. Pre-amorphization can generally be achieved by bombarding with about $1 \times 10^{13}$ to about $1 \times 10^{15}$ atoms/cm$^2$ at an energy from about 5 to about 100 keV. For example, a pre-amorphized layer from about 15 to about 20 nm thick in silicon can be produced using about $1 \times 10^{14}$ to about $2 \times 10^{14}$ atoms/cm$^2$ Ge at an energy of about 15 keV, or alternatively with about $4 \times 10^{13}$ to about $5 \times 10^{13}$ atoms/cm$^2$ In or Sb at an energy of about 25 keV.

Act 203 is implanting a temporary dopant within the pre-amorphized layer. The temporary dopant or impurity atom can include any suitable species that forms an interstitial species having a higher diffusivity within the semiconductor crystal than interstitials of the semiconductor itself. Examples of suitable temporary dopants include fluorine and carbon. In one embodiment, the temporary dopant is implanted with a dose in the range from about $1 \times 10^{13}$ to about $1 \times 10^{18}$ atoms/cm$^2$. In another embodiment, the temporary dopant is implanted with a dose in the range from about $1 \times 10^{14}$ to about $1 \times 10^{17}$ atoms/cm$^2$. In a further embodiment, the temporary dopant is implanted with a dose in the range from about $5 \times 10^{14}$ to about $1 \times 10^{16}$ atoms/cm$^2$. As a specific example, fluorine can be implanted with a dose from about $1 \times 10^{15}$ to about $2 \times 10^{15}$ atoms/cm$^2$.

The depth of penetration of the temporary dopant can be controlled through the energy level imparted to the ions used to form the implant. The energy is selected so that the temporary dopant is substantially limited to the pre-amorphized layer. For example, a fluorine implant can be carried out at an energy of about 2 to about 3 keV. Diffusion tends to cause the temporary dopant to become evenly dispersed within the pre-amorphized layer.

Act 205 is re-growing the semiconductor crystal within the pre-amorphized layer whereby the temporary dopant becomes incorporated into the crystal matrix. The crystal generally re-grows from the intact portion beneath the pre-amorphized layer. Mild heating, such as in the temperature range from about 500° C. to about 600° C. for about 10 minutes to about an hour, generally brings about crystal re-growth. For example, a silicon crystal can generally be re-grown by maintaining it at a temperature of about 600° C. for about half an hour.

Act 207 is forming over the substrate surface a layer of solid material that contains the target dopant. Generally, the layer of solid material is formed by chemical vapor deposition (CVD). Pre-cleaning of the substrate surface is commonly employed to improve the reproducibility of the process. The solid material includes a suitable concentration of the target dopant and generally a carrier material. Suitable carrier materials include, for example, silicate glasses. Preferably, the interstitial species of the temporary dopant has a high solubility in the solid material or reacts with the solid material during the annealing 209 and thereby acts as a sink for interstitial species of the temporary dopant.

Any suitable concentration of the target dopant in the carrier material can be used, but it is preferred that the concentration is such that at an equilibrium between the solid material and the semiconductor crystal, the target dopant concentration within the semiconductor crystal is near saturation. In such manner, increasing the concentration of the target dopant within the solid material does little to increase the concentration of the target dopant within the semiconductor crystal. In one embodiment, the concentration of the target dopant within the solid material is such that an equilibrium concentration within the semiconductor crystal is at least about 50% of saturation. In another embodiment, the concentration provides an equilibrium value of at least about 75% of saturation. In a further embodiment, the concentration provides an equilibrium value of at least about 90% of saturation.

The target dopant can be any of the dopants used to change the conductivity type of a semiconductor substrate. An example of a suitable target dopant is boron. Another example of a suitable target dopant is phosphorus. Prior to applying a process of the invention, the substrate is typically given a blanket implant of a dopant having a conductivity type opposite that of the target dopant, whereby P-N junctions form at the borders of the regions implanted according to the present invention.

Act 209 is annealing, which in this context means heating briefly to a high temperature. Heating causes the target dopant to diffuse into the semiconductor crystal and to become incorporated into its matrix. During annealing 209, a portion of the temporary dopant forms interstitial species that diffuse out of the semiconductor crystal. Annealing 209 also repairs defects in the semiconductor crystal.

Annealing 209 is rapid and may be referred to as rapid thermal annealing. The peak annealing temperature is typically from about 950° C. to about 1100° C. and is maintained very briefly, generally as briefly as equipment permits. For example, annealing may involve heating to a temperature of 1050° C. for about 0.5 seconds. As annealing times are made shorter, higher temperatures can be employed.

After annealing 209, the target dopant is diffused into the semiconductor crystal and affects the conductivity type of the crystal within a thin layer near the surface. Preferably, the target dopant affects the conductivity type within a layer that is about 50 nm or less, more preferably about 30 nm or less, and still more preferably about 10 nm or less. In one embodiment, the concentration of the target dopant within the thin layer reaches at least about $1 \times 10^{19}$ atom/cm$^3$. In another embodiment, the concentration of the target dopant reaches at least about $1 \times 10^{20}$ atom/cm$^3$. In a further embodiment, the concentration of the target dopant reaches at least about $5 \times 10^{20}$ atom/cm$^3$.

As discussed above, the annealing causes a portion of the target atoms (e.g., boron dopant) in the carrier material to enter the substrate. Concurrently, the temporary dopant in the substrate react with the interstitials within the substrate to form interstitial species which out-diffuse. Such out-diffusion then reduces an amount or depth in which the targets atoms diffuse in the substrate by reducing the number of interstitials in the substrate that would otherwise tend to enhance diffusivity. In the above manner, the depth of the target atoms is reduced, thereby resulting advantageously in shallow junctions.

Figure 3:
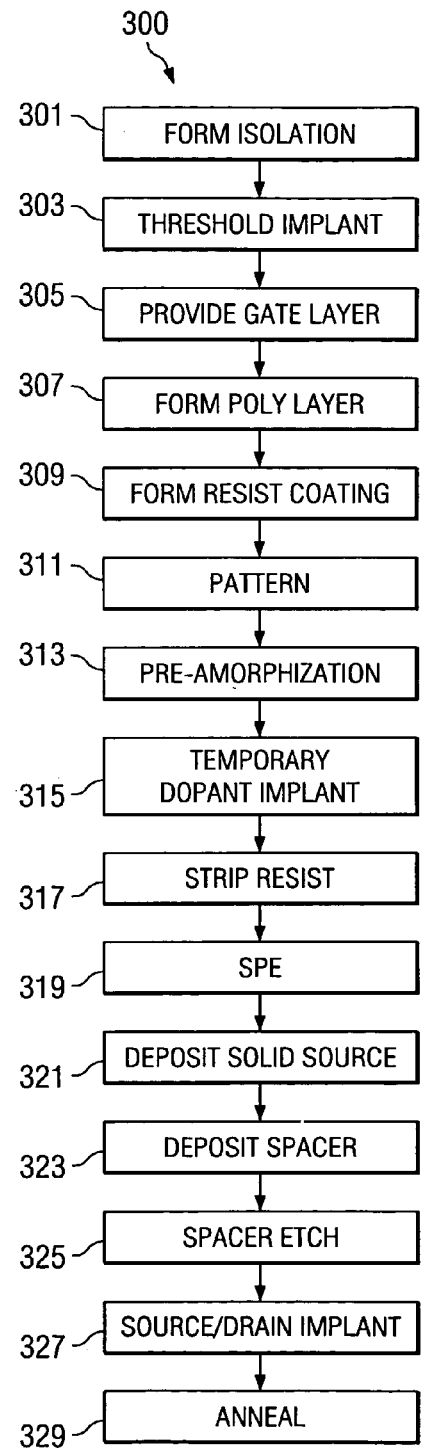
FIG. 3 is a flow chart of a process according to another aspect of the present invention.

FIG. 3 is a flow chart of an exemplary process 300 for making a CMOS device in accordance with another aspect of the present invention. As with the process 200, the present invention is not limited by the illustrated ordering of the process 300, as some acts may occur in different orders and/or concurrently. In addition, not all illustrated acts or events are required to implement a methodology in accordance with the present invention.

Figure 4:
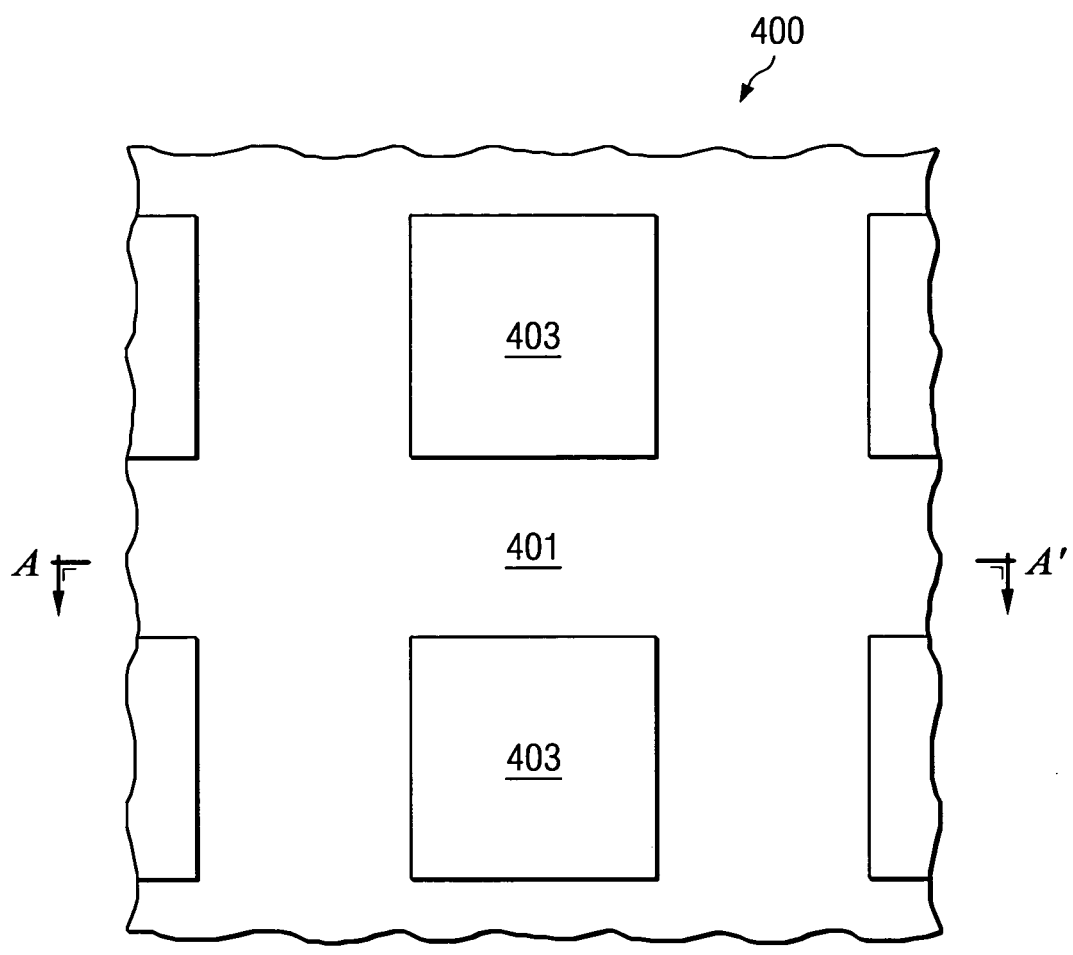
FIG. 4 is a schematic illustration of a substrate in which field oxide islands have been created.

Act 301 is forming isolation regions on a semiconductor substrate. This is illustrated with device 400 in FIG. 4. The device 400 includes a semiconductor substrate 401 and field oxide islands 403. The field oxide can comprise any suitable insulator, including for example silicon dioxide or tetraethyl orthosilicate (TEOS). The field oxide islands 403 can be formed by any suitable process, for example LOCOS (local oxidation of silicon) or STI (shallow trench isolation).

Act 303 is providing a threshold implant to the semiconductor of the substrate. This implant provides a first conductivity type within a layer of the semiconductor adjacent a surface of the substrate.

Act 305 is providing a gate layer. Generally, gate layers are formed with silicon dioxide and are referred to as gate oxide layers. However, for very small devices, it is often desirable to use a material that has a lower electrical resistance than silicon dioxide and can be provided in greater thickness than an equivalent silicon dioxide layer. Such materials are referred to as high-k dielectrics and include silicates, aluminates, titanates, and metal oxides. Examples of silicate high-k dielectrics include silicates of Ta, Al, Ti, Zr, Y, La and Hf, including Zr and Hf doped silicon oxides and silicon oxynitrides. Examples of aluminates include transition metal aluminates, such as compounds of Zr and Hf. Examples of titanate high-k dielectrics include BaTiO$_3$, SrTiO$_3$, and PdZrTiO$_3$. Examples of metal oxide high-k dielectrics include oxides of refractory metals, such as Zr and Hf, and oxides of Lanthanide series metals, such as La, Lu, Eu, Pr, Nd, Gd, and Dy. Additional examples of metal oxide high-k dielectrics include Al$_2$O$_3$, TiO$_2$, Ta$_2$O$_5$, Nb$_2$O$_5$ and Y$_2$O$_3$.

The gate layer is formed by any suitable process including, for example, oxidation, spin coating, or CVD. In one embodiment, the layer is from about 1 nm to about 100 nm thick. In another embodiment, the layer is from about 3 nm to about 50 nm thick. In a further embodiment, the layer is from about 5 nm to about 30 nm thick.

Figure 5:
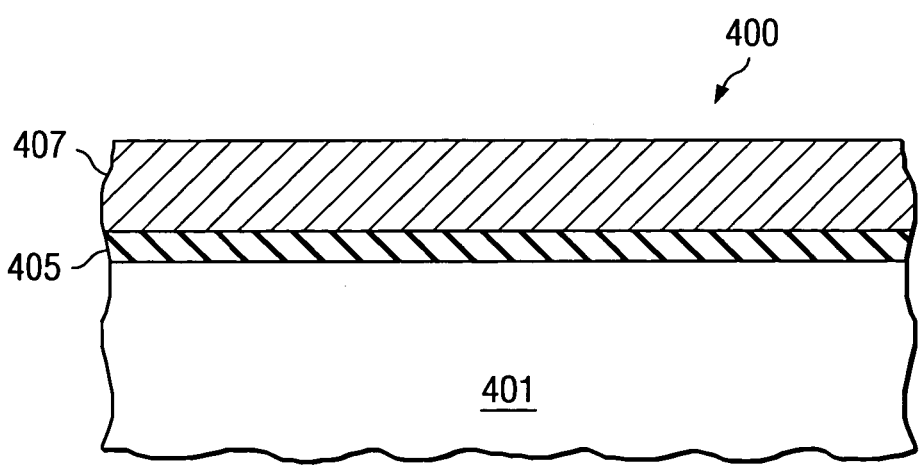
FIG. 5 is a schematic illustration showing a cross-section of the substrate of FIG. 4 along the line A–A' after forming a gate layer and a poly layer.

Act 307 is forming a poly layer over the gate layer. FIG. 5 illustrates a cross-section of the substrate 400, taken along the line A–A' of FIG. 4, after formation of a gate layer 405 and a poly layer 407. A poly layer is one containing either amorphous silicon or polysilicon. In one embodiment, the poly layer has a thickness of about 40 nm to about 120 nm. In another embodiment, the poly layer has a thickness of about 50 nm to about 1000 nm. In a further embodiment, the poly layer has a thickness of about 60 nm to about 90 nm.

Figure 6:
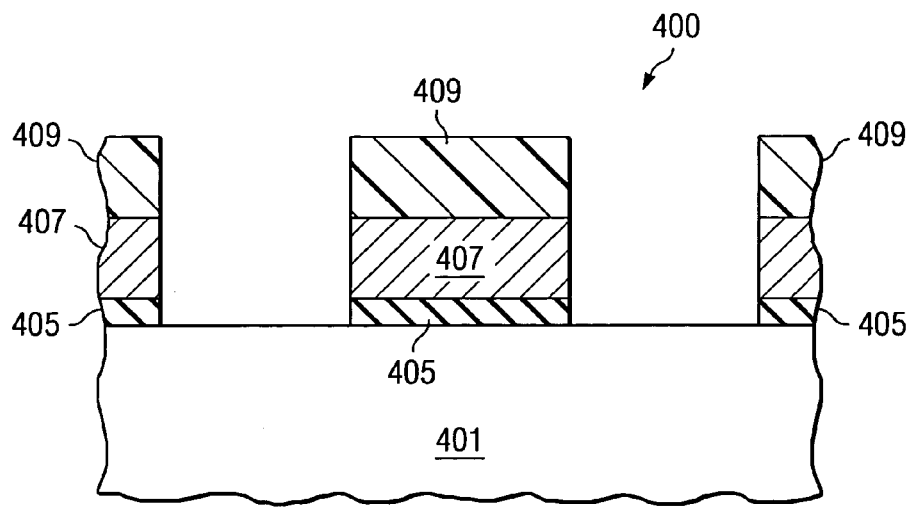
FIG. 6 is a schematic illustration showing the cross-section of FIG. 5 after forming a resist coating and patterning.

Act 309 is forming a resist coating over the poly layer. Any suitable resist may be used. The resist is lithographically patterned in act 311 and the pattern is transferred to by etching the exposed portion of the underlying poly and gate layers. FIG. 6 illustrates the substrate 400 after patterning with the resist coating 409.

The pattern includes gaps that have any suitable size or shape. In one embodiment, the pattern includes gaps having widths within the range from about from 0.01 to about 10 μm. In another embodiment, the pattern includes gaps having widths within the range from about from 0.05 to about 1.0 μm. In a further embodiment, the pattern includes gaps having widths within the range from about from 0.1 to about 0.5 μm.

Figure 7:
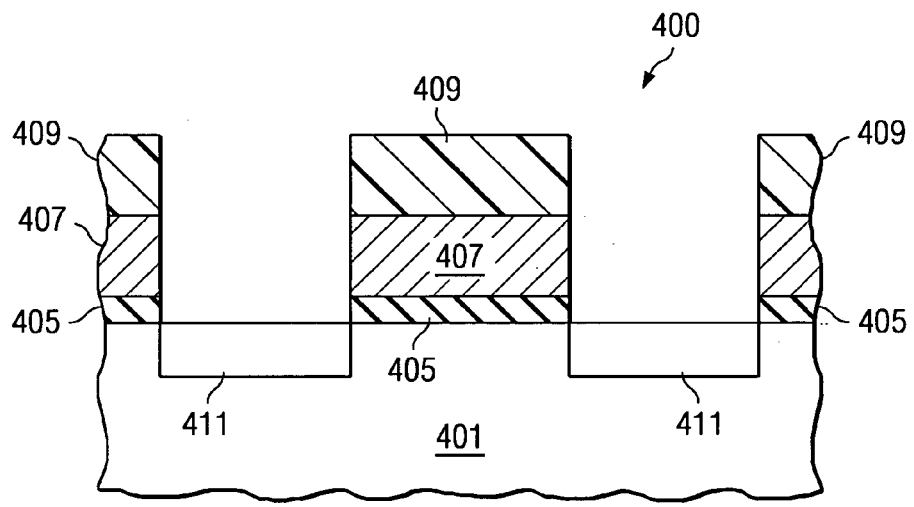
FIG. 7 is a schematic illustration showing the cross-section of FIG. 6 after pre-amorphizing a layer of the substrate.

Act 313 is pre-amorphization, which can be carried out without any additional masking, giving a structure such as illustrated in FIG. 7. In FIG. 7, the semiconductor 401 is pre-amorphized within the layer 411 where it is exposed in gaps patterned within the resist 409, the poly layer 407, and the gate layer 405.

Figure 8:
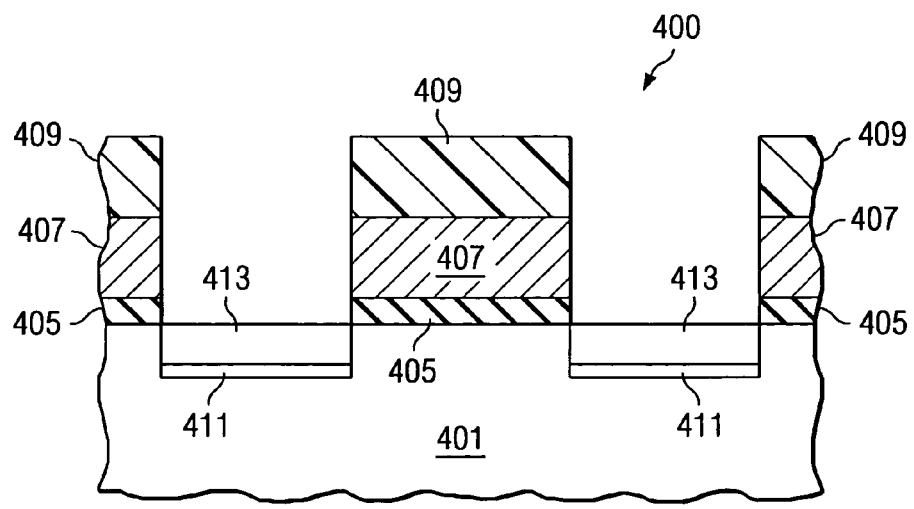
FIG. 8 is a schematic illustration showing the cross-section of FIG. 7 after implanting a temporary dopant.

Act 315 is implanting the temporary dopant. This can also be done without any additional masking. FIG. 8 illustrates a layer 413 within semiconductor 401 that has received the temporary dopant implant. The layer 413 is contained within the amorphized layer 411.

Act 317 is stripping the resist. The resist can be stripped at any suitable point in the process 300 of FIG. 3.

Figure 9:
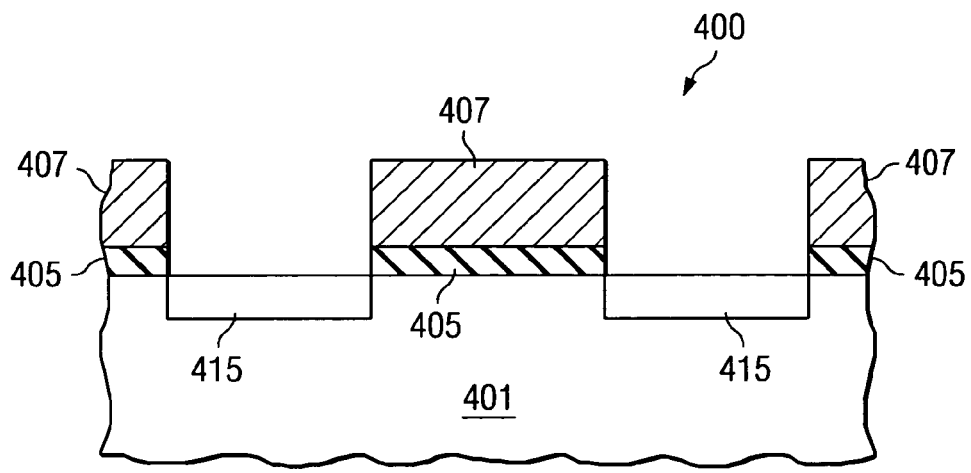
FIG. 9 is a schematic illustration showing the cross-section of FIG. 8 after solid phase epitaxial growth.

Act 319 is solid phase epitaxial growth, wherein the crystalline structure within the amorphized portion of the semiconductor 401 is substantially repaired while incorporating the temporary dopant. FIG. 9 illustrates a resulting layer 415 of the semiconductor 401 in which the temporary dopant is substituted within the crystal matrix.

Figure 10:
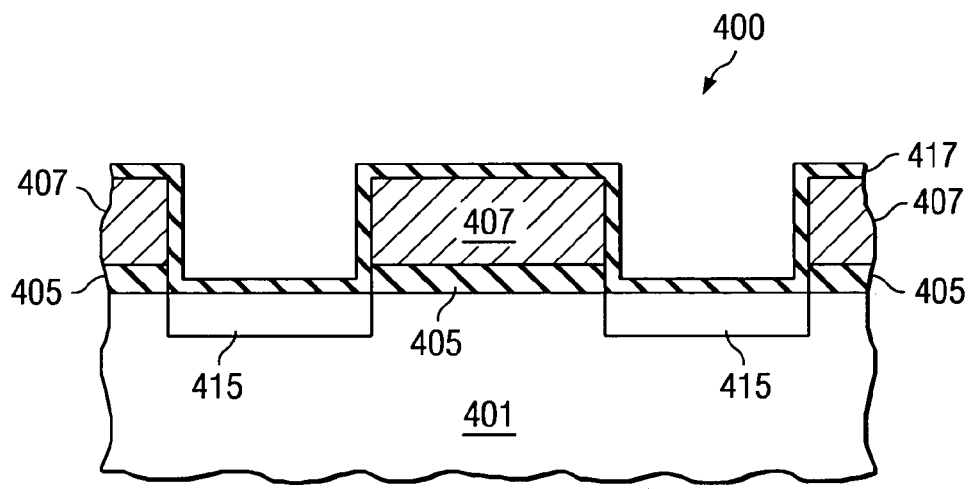
FIG. 10 is a schematic illustration showing the cross-section of FIG. 9 after depositing a solid source.

Act 321 is deposition of a solid source for the target dopant. Deposition of the solid source generally involves heating the substrate. Thus, Act 321 can, in some instances, be carried out concurrently with Act 319, SPE. FIG. 10 illustrates the device 400 after deposition of the solid source 417.

Figure 11:
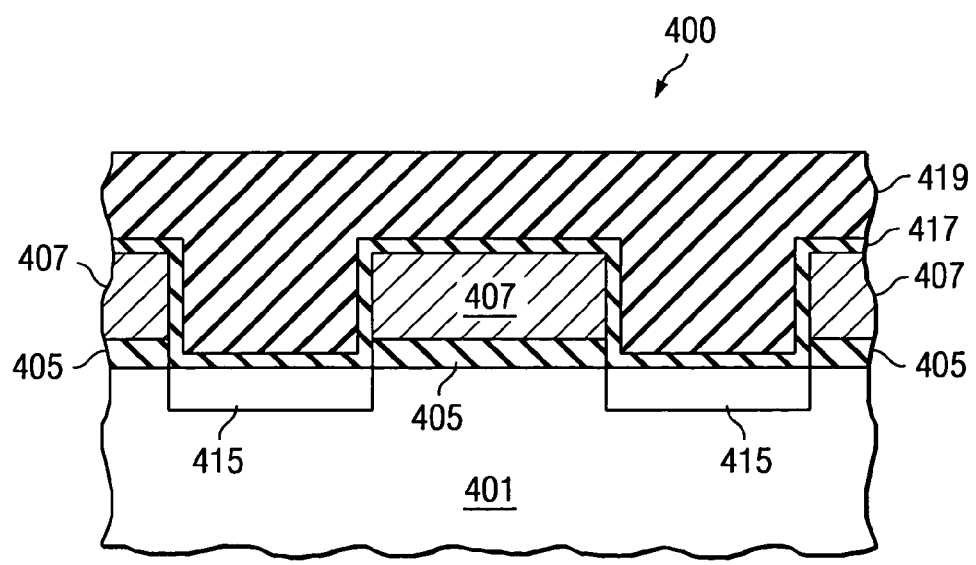
FIG. 11 is a schematic illustration showing the cross-section of FIG. 10 after depositing a spacer material.

Act 323 is depositing a spacer material. Optionally, the spacer material is the same as the solid source, in which case Acts 321 and 323 can be combined. FIG. 11 illustrates the device 400 after deposition of the spacer material 419.

Figure 12:
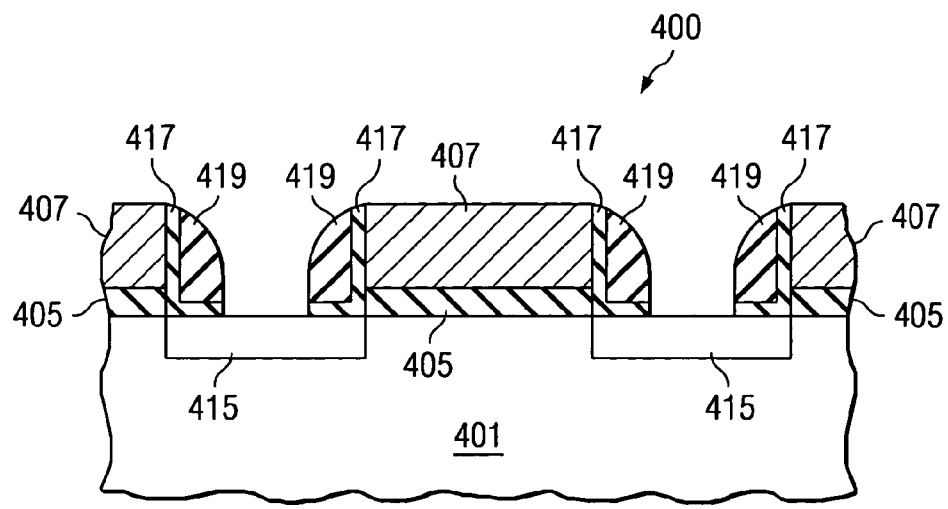
FIG. 12 is a schematic illustration showing the cross-section of FIG. 11 after etching the spacer material and the solid source.

Act 325 is a spacer etch. The spacer etch 325 generally etches the solid source as well as the spacer material, whereby the spacer material and the solid source remain only adjacent the gate stacks, as illustrated for the device 400 in FIG. 12.

Figure 13:
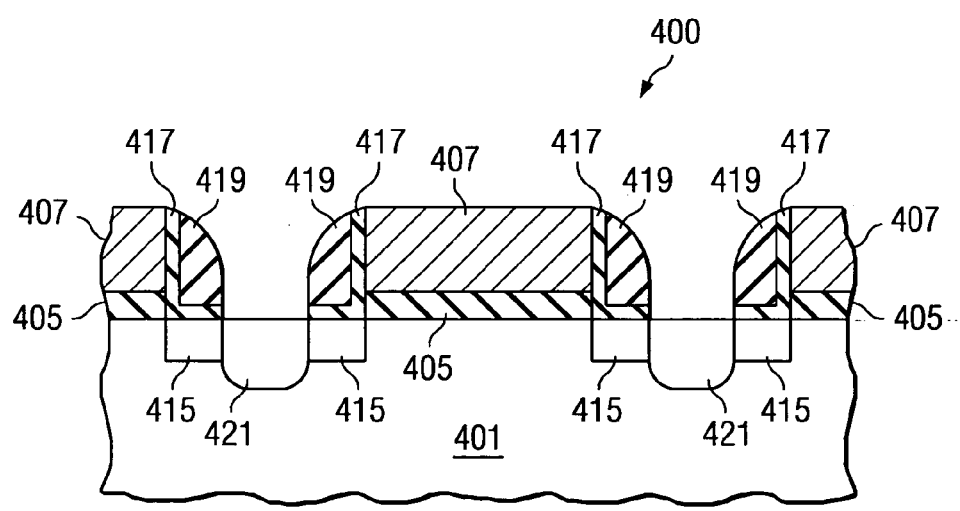
FIG. 13 is a schematic illustration showing the cross-section of FIG. 12 after implanting source/drain regions.

Act 327 is a source/drain implant. The ordering of this step is exemplary, as the source/drain implant can be provided either earlier or later in the process. FIG. 13 illustrates the device 400 provided with source/drain regions 421. The spacer material 419 creates a separation between the source/drain regions 421 and the gate stacks.

Figure 14:
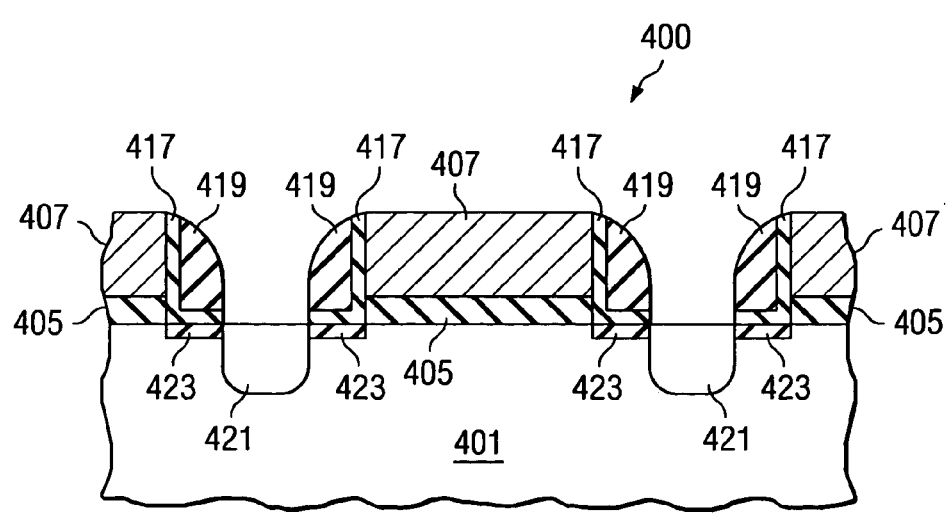
FIG. 14 is a schematic illustration showing the cross-section of FIG. 14 after annealing.

Act 329 is annealing. Annealing causes the target dopant to diffuse in the semiconductor and form shallow junctions while the temporary dopant out-diffuses. FIG. 14 illustrates substrate 400 after the formation of shallow junctions 423. In this example, annealing also repairs defects created during Act 327, the source/drain implant.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description and the claims, such terms are intended to be inclusive in a manner similar to the term "comprising."

What is claimed is:

1. A method of forming transistors, comprising:
   forming a gate layer on a substrate comprising a semiconductor crystal;
   forming a poly layer over the gate layer;
   forming a patterned resist over the poly layer;
   etching to pattern the poly layer and the gate layer, whereby a surface of the substrate is exposed;
   pre-amorphizing a first layer of the semiconductor crystal adjacent the surface;
   implanting a second layer of the substrate adjacent the surface with a temporary impurity atom;
   after implanting, heating to re-grow the semiconductor crystal within the first layer;
   either before or after heating, forming a target dopant layer comprising a target dopant over the surface; and
   annealing to cause the target dopant to diffuse from the target dopant layer into the substrate.

2. The method of claim 1, further comprising:
   except where the target dopant layer functions as a spacer layer, forming a spacer layer comprising a spacer material over the target dopant layer; and
   prior to annealing, etching the target dopant layer, and optionally the spacer layer, to form spacers.

3. The method of claim 2, wherein the target dopant layer functions as a spacer layer.

4. The method of claim 1, wherein the gate layer comprises a high-k dielectric.

5. The method of claim 1, wherein the second layer adjacent the substrate surface is within the first layer.

* * * * *